US007299142B2

(12) United States Patent
Burnett

(10) Patent No.: US 7,299,142 B2
(45) Date of Patent: Nov. 20, 2007

(54) SYSTEM AND METHOD FOR PREVENTION OF ACCIDENTAL ACTIVATION OF PORTABLE AUDIO DEVICE

(75) Inventor: Robert Burnett, Dakota Dunes, SD (US)

(73) Assignee: Gateway Inc., Irvine, CA (US)

( * ) Notice: Subject to any disclaimer, the term of this patent is extended or adjusted under 35 U.S.C. 154(b) by 657 days.

(21) Appl. No.: 10/646,165

(22) Filed: Aug. 22, 2003

(65) Prior Publication Data

US 2005/0055731 A1 Mar. 10, 2005

(51) Int. Cl.
*G01R 31/36* (2006.01)

(52) U.S. Cl. ............................ 702/63; 381/56; 381/74; 381/384; 455/575.2; 379/430

(58) Field of Classification Search .................. 702/63; 381/74, 384, 374, 377; 455/575.2, 569.1; 379/430; 345/169, 901; 434/317
See application file for complete search history.

(56) References Cited

U.S. PATENT DOCUMENTS 5,504,812 A * 4/1996 Vangarde .................... 379/430
5,557,653 A * 9/1996 Paterson et al. ......... 455/575.2
5,596,638 A * 1/1997 Paterson et al. ......... 455/575.2
5,832,075 A * 11/1998 Gancarcik ................... 379/377
6,897,850 B2 * 5/2005 Sugimoto ................... 345/169
2006/0029234 A1 * 2/2006 Sargaison .................... 381/74

* cited by examiner

*Primary Examiner*—Michael P. Nghiem
*Assistant Examiner*—Hien Vo
(74) *Attorney, Agent, or Firm*—Ross F. Hunt, Jr.; Stites & Harbison PLLC

(57) ABSTRACT

A system and method are provided for preventing battery rundown. The system includes an output device for presenting a media data stream, a communication port for linking to the output device, and a controller coupled to the port. The controller is programmed to detect the existence or absence of a link between the output device and the port, pause output of the media data stream if no link is detected within a first time period, and shut down operation of an electronic device after a second time period of longer duration than the first, if no communication link is detected.

20 Claims, 4 Drawing Sheets

SYSTEM AND METHOD FOR PREVENTION OF ACCIDENTAL ACTIVATION OF PORTABLE AUDIO DEVICE

FIELD OF THE INVENTION

The present invention generally relates to the field of portable electronics and particularly to a system and method for preventing accidental activation of a battery powered portable audio device.

BACKGROUND OF THE INVENTION

Portable electronics devices, such as cassette players, portable radios, Compact Disk (CD) players, and Moving Pictures Experts Group Audio Layer-3 (MP3) players have permeated everyday life. Portable audio devices allow users convenient access to audio performances while minimizing the impact on a user's mobility. Typically, portable audio devices are battery powered. A drawback to battery power is that these devices may quickly consume the battery's stored electrical energy. Thus, a user may have to replace the battery or recharge the battery. Users may find themselves having to carry spare batteries, if they wish to use the device for a long time period, or if they are unsure of how much useful life is remaining in the battery. Additionally, recharging batteries may be inconvenient or time consuming.

Another drawback is that the portable device may be inadvertently activated when removable headphones are disconnected from the main unit. For instance, a MP3 player may be accidentally powered on when the system's earphones are not connected. In this situation, the MP3 player's batteries may become prematurely rundown which requires the purchase of additional batteries, time consuming recharging, and, perhaps, user dissatisfaction. Further, portable audio devices may utilize wireless connection such as Bluetooth, Infrared, radio frequency (RF), and the like to communicate with an output device. For example, a CD player may utilize a wireless connection with a headset to avoid the need for a cord between the unit and the headset. When wireless communication is utilized, the output device may be removed beyond the effective range of the main unit resulting in the main unit running down the battery source without providing a tangible benefit to the user. This difficulty may go unnoticed because the user may become distracted, thus forgetting that the main unit is still operating.

Therefore, it would be desirable to provide a system and method for automatically reducing power consumption or turning off the portable electronic device including the system when an output device is not present.

SUMMARY OF THE INVENTION

Accordingly, the present invention is directed to a system and method for detecting the existence or absence of a communication link between a portable media device and an output device. The system and method of the present invention may prevent accidental battery or power consumption when an output device is not linked to the electronic device including the system.

In an aspect of the present invention, a system for preventing battery rundown includes an output device for presenting a media data stream, a communication port for linking to the output device and a controller coupled to the port. The controller is programmed to detect the existence or absence of a link between the output device and port, pause output of the media data stream if no link is detected within a first time period, and shut down operation of an electronic device after a second time period of longer duration than the first, if no communication link is detected.

In a further aspect of the invention, a method for preventing accidental operation includes the steps of: detecting the existence of a communication link between an output device, and a communication port included in a portable audio device. If no link is detected within a first time period, a system implementing the method pauses media data stream output. If no link is detected within a second longer time period, the method includes the step of ceasing operations of the portable audio device.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown wherein a system and method for preventing battery rundown is disclosed. The system and method of the present invention may minimize or eliminate the power consumed by an electronic device when no communication link exists between a main unit and an output device.

Figure 1:
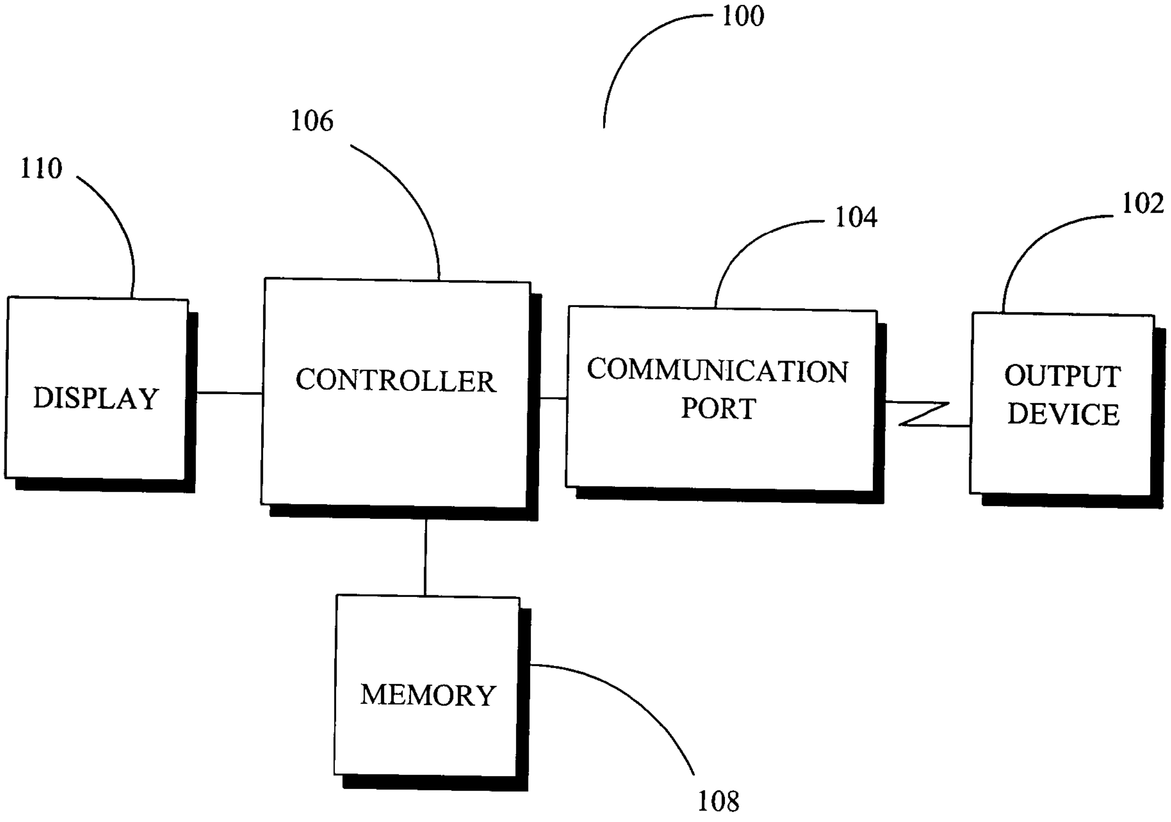
FIG. 1 is a block diagram of a system for preventing battery run-down.

Referring to FIG. 1, in a first embodiment, a system 100 for preventing unnecessary battery run-down is disclosed. The system 100 may prevent the inadvertent consumption of battery power when an output device is not communicatively linked thereby extending the useful life of the batteries. In the present embodiment, an output device 102 is included in the system 100. For instance, the output device is a pair of headphones including a one-eighth inch mini-connector plug. Other suitable output devices include speakers, video displays, earpieces, and the like for presenting media data. In further embodiments, the output device may include a wireless communication connection for wirelessly communicating, such as via Radio Frequency (RF) connection, Infrared (IR) connection, Bluetooth link, and the like for wireless communication.

A communication port 104 may be configured so as to communicatively link with the output device 102. For instance, the communication port 104 is a one-eighth inch plug port for accepting a one-eighth inch mini-connector plug. In the current embodiment, the communicative link is a hardwired connection between the output device 102 and the communication port 104. In a further example, the communication port is a Bluetooth communication connection for communicating with a wireless head-set via a wireless Bluetooth protocol link.

A controller 106 is further included in the system 100. For example, the controller is the main processing unit of a portable audio device for controlling audio data stream output. In the present aspect, the controller is preprogrammed to detect the existence of a communication link between the output device 102 and the communication port 104. In additional examples, a program of instructions may be stored in memory 108 and forwarded as part of the processor's firmware or the like. For instance, a controller may detect the connection of a headphone set connected via a one-eighth inch mini-connector plug to a corresponding plug port via detecting a change in impedance due to the physical connection of the plug to the port. In a further example, when utilizing a wireless link the controller may cause the output device and the communication port to conduct a handshake protocol to verify the existence of a link. Additionally, the controller may intermittently detect the existence of the communication port/output device link during usage to determine if the link is disrupted. Those of skill in the art will appreciate that various electrical/wireless communication methods may be employed for detecting the existence of a communication link between an outlet port and an output device without departing from the scope and spirit of the present invention. It is the intention of this disclosure to encompass and included such variation.

In the current embodiment, if no communication link is detected between the communication port and the output device within a first set time period, the controller is configured to pause output of the media data stream. For instance, if the output device is accidentally unplugged, the controller will pause output of the data stream after a set time period to conserve battery life. Additionally, the controller 102 may indicate the existing condition by outputting an indicia on an associated display 110 such as "Attach headphones" or the like. See generally FIG. 4. Additionally, the controller 102 may execute a detection protocol after a communication link disruption. For example, upon determining that no link exists, the controller may scan repeatedly for the link. In a further example, upon determination of a communication link disruption, the controller may scan once-a-second for ten seconds to assess whether the link is reestablished. If after a second time period, which is of a longer duration than the first time period (when started at the same point in time), the communication link between the output device and the communication port is not detected (due to a failure to reestablish a link) the controller is further configured so as turn off or cease operation of the electronic device including the system 100. For instance, if a controller, included in a MP3 player fails to detect the connection of the associated headphones within a minute of a previous attempt to detect the communication link the controller may initiate turning off the MP3 player. For example, utilizing the system 100 of the present embodiment may prevent a portable audio device from accidentally consuming energy if the wireless output device is removed from the zone or range in which the system's components may communicate. If, for example, a user removes a wireless headphone set beyond the effective range of communication for the main unit, or the like.

In further embodiments, the controller may be an application specific integrated circuit (ASIC) configured so as to: detect the existence (or lack thereof) of a communication link between an output device and a communication port, pause output of a media stream in response to the lack of the communication link, and to shut down operation of the electronic device including the system 100 if no link is detected within a second time period.

Figure 2:
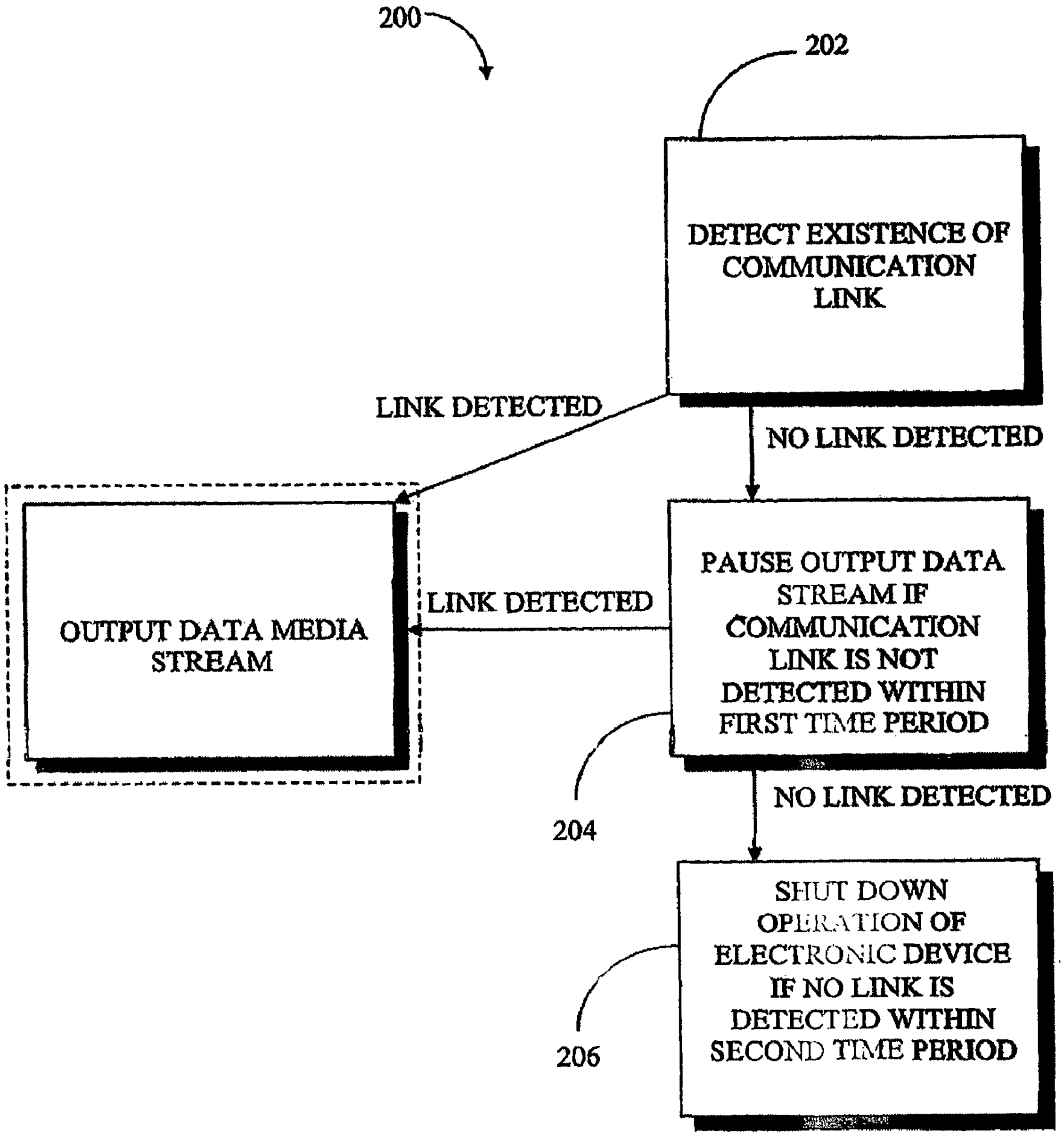
FIG. 2 is a flow chart of an exemplary method of the present invention.

Referring to FIG. 2, in a further embodiment, a method 200 for preventing accidental operation of a battery powered device is disclosed. Initially, the method 200 commences by detecting 202 the existence of a communication link between a communication port and an output device. For example, a controller included in a compact disk player detects whether the impedance of a communication port/headphone is commensurate with the headphones being connected to the communication port. In a further example, a controller detects the existence of the wireless headphones by conducting a handshake communication protocol to determine whether the headphones are within range of a main unit so as to commence audio output. Additionally, the controller may intermittently initiate detection to assess whether the output device is communicatively linked, such as by conducting a handshake protocol (in the case of a wireless link) or the like.

If no communication link is detected, the output data stream is paused 204. For instance, a portable CD player may halt output of the audio data stream until a communication link is reestablished. In the case of a mechanical link, a controller included in the CD player may recommence audio output after determining the existence of a communication link between an output port and the removable headset. In a further example, data stream output is halted after a first time period wherein the output device is not linked with the communication port. For instance, data output may be paused 10 seconds after disruption of the link. In further examples, disruption of a communication link between an outlet port and the output device may cause the controller to initiate a detection protocol or scenario wherein the controller scans for a communication link for a set interval. For instance, upon determining that no communication link exists, the controller may scan once-a-second for fifteen seconds to determine if the link is reestablished. Reestablishment of the link may result in the recommencement or initiation of the media data output stream.

If no communication link is detected after a second time period, of a longer duration than the first time period (when commenced from the same point in time), operation of the audio device may be shut-down 206. For instance, if the controller fails to detect the existence of a communication link between the output device and the communication port within one minute of the data stream being paused, the controller may shut-down operation of the portable audio device. If on the other hand, a communication link is detected within the second time period, recommencement (or initiation) of the output media data stream may occur.

Figure 3:
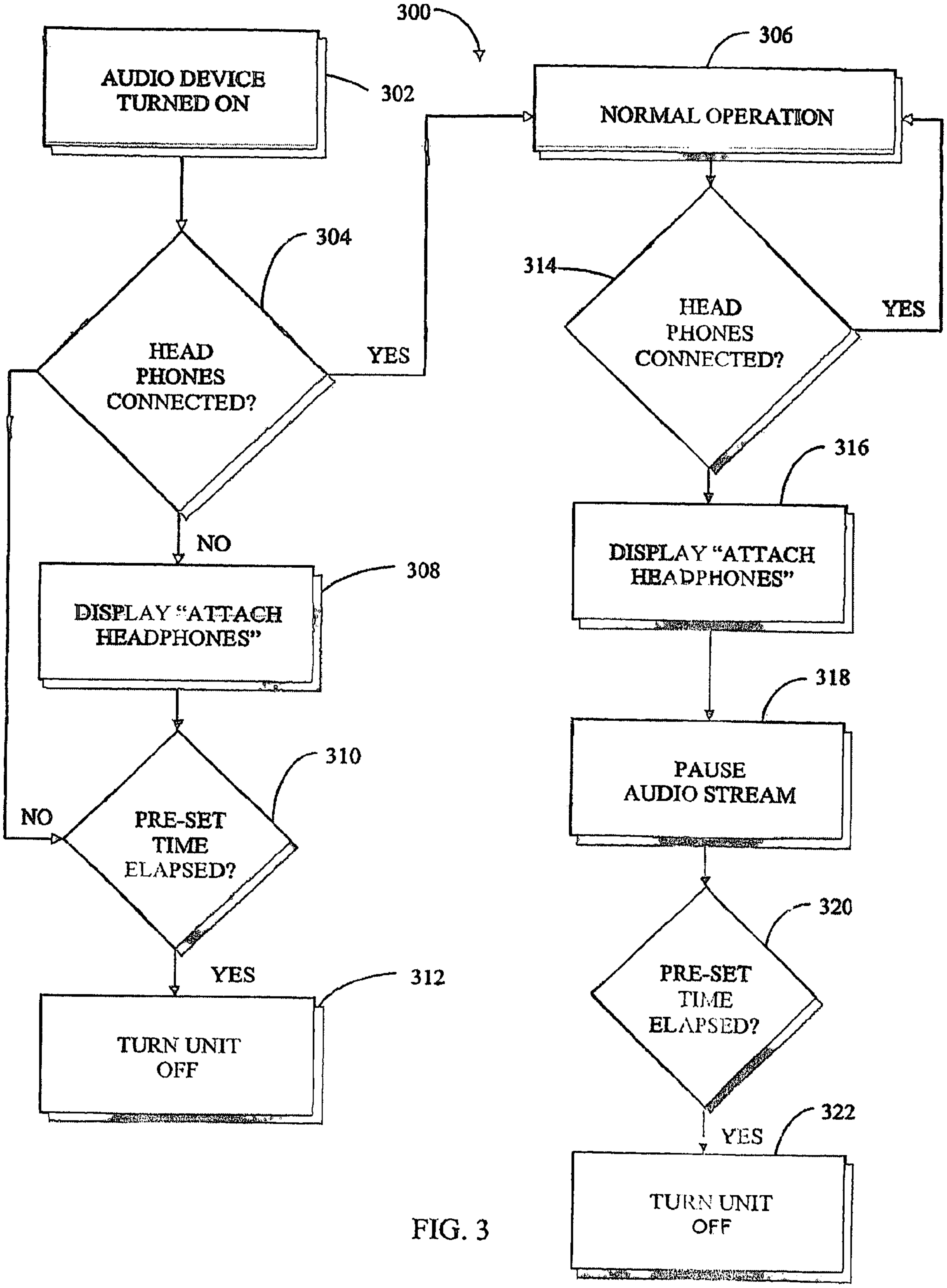
FIG. 3 is a flow diagram of a further method including the step of alerting a user to the lack of a communication link between a communication porting included in a portable audio device and an output device.
Figure 4:
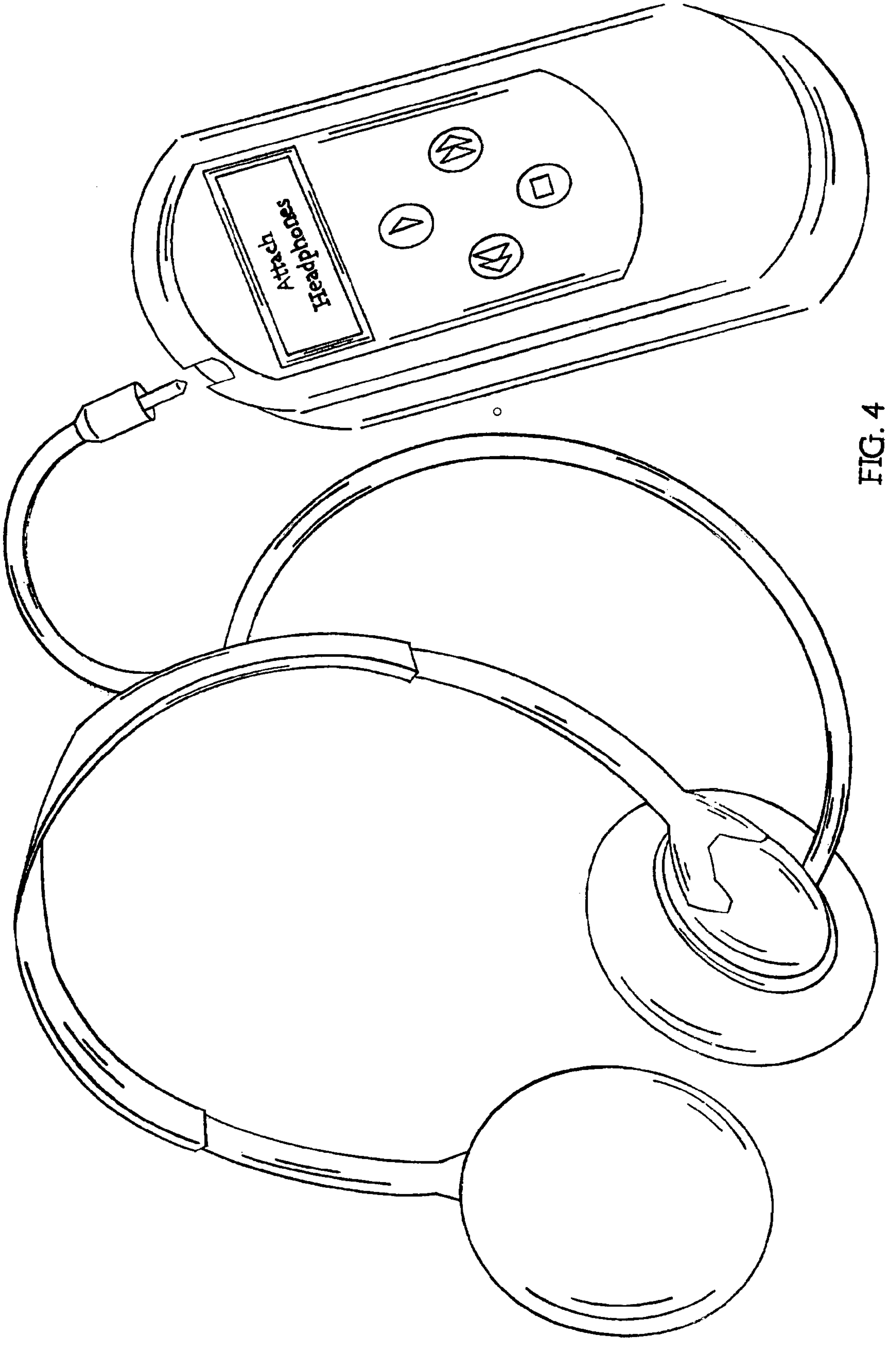
FIG. 4 is a MP3 player including a system for preventing accidental battery run-down.

Referring now to FIG. 3, in a further embodiment, a method 300 for preventing accidental battery rundown is described. The method is initiated upon turning on 302 the audio device. Once initiated, a system employing the present method detects whether an associated output device is connected. For example, at step 304 the system ascertains whether a pair of headphones is connected to the main unit.

If a communication link exists between the headphones and a communication port, the method continues with normal operation 306. For instance, an audio data stream is communicated to the output device. Alternatively, if no communication link is detected, the method includes prompting a user to communicatively link the removable output device. For instance, the system will prompt the user to "Attach Headphones" 308. If a set time period expires without an output device being linked 310, the system will proceed to turn off power to the electronic device 312.

During normal operation 306, the controller included in the system conducting the present method will intermittently detect the existence of a communication link during use 314. If no communication link is detected the user is prompted, such as via a display, to "Attach Headphones" 316. If no connection is detected within a set time period the audio output stream is paused 318. For example, an MP3 player employing the present method may immediately halt media data stream output or halt after a set timer period has elapsed. In further examples, live broadcasts such as via FM radio may not output during a "pause" in operation. If the user fails to communicatively link the output device within a desired time which may be of a longer duration then the time period for pausing operation, power is turned off 322 to the device employing the current method.

Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

The present invention is described herein in terms of a portable audio device using the MPEG Audio Layer-III (MP3) format. However, the invention may also be embodied using various other hardware or software configurations or other encoding formats or schemes such as, but not limited to, the following: WAV (.wav); AIIF (.aiff); Quicktime (.qt); Windows Media Audio (.wma); AU (.au); CD audio (i.e., CCDA); G.711 mu-law or A-law (.au); MPEG-1, MPEG-3, or MPEG-4 (e.g., .mpa, .mp2); IMA/DVI ADPCM (.wav); GSM 06.10 (.gsm); InterWave VSC112 (or VCS77, VCS154 or VCS224) (e.g., .vmf); TrueSpeech 8.5 (or 4.8, 5.3 or 6.3) (.wav); RealAudio v1.0 (.ra or ram); ToolVox for the Web (.vox); ASPEC; MUSICAM; Dolby Digital (AC-3); EPAC; TAC; TwinVQ; or the like.

It is believed that the system and method of the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. A system for preventing unnecessary battery run-down, comprising:

an output device for presenting a media data stream;

a communication port configured for communicatively linking with the output device; and a controller, communicatively coupled to the communication port, for controlling output of the media data stream, said controller being configured to execute a program of instructions, wherein the program of instructions causes the controller to:

detect the existence of a communicative link between the output device and the communication port;

pause output of the media data stream to the output device after a first predetermined time period, if no communicative link exist between the output device and the communication port; and shut down operation of an electronic device including the system after a second time period, if no communication link exists between the output and the communication port, said second time period being of a longer duration than said first time period, wherein the system minimizes the amount of energy consumed by the electronic device.

2. The system of claim 1, wherein the media data stream is an audio presentation.

3. The system of claim 1, further comprising a display communicatively coupled to said controller, wherein said controller is additionally configured so as to indicate the absence of the output device on the display within said first time period, if no communication link is detected between the output device and the communication port.

4. The system of claim 1, wherein the controller is additionally configured to output the media data stream upon establishment of a communicative link between the output device and the communication port within either of said first or said second time periods.

5. The system of claim 1, wherein the output device is a pair of headphones and the communication port is a one-eighth inch mini-connector plug jack.

6. The system of claim 1, wherein the output device and the communication port link via a wireless connection.

7. The system of claim 1, wherein the output device and the communication connection link via a Bluetooth connection.

8. The system of claim 1, wherein the system is implemented in at least one of a compact disk player, a cassette tape player, a portable radio, and a moving pictures experts group audio layer-3 (MP3) player.

9. The system of claim 1, wherein the controller is a microprocessor.

10. A method for preventing accidental operation of a battery powered portable audio device, comprising the steps of:

detecting the existence of a communicative link between an output device and a communication port included in the portable audio device;

pausing output of an audio data stream to the output device after a first time period, if no communicative link exist between the output device and the communication port; and shutting-down operation of the portable audio device after a second time period, if no communication link exists between the output and the communication port, said second time period being of a longer duration than said first time period, the method further comprising the step of displaying an indication of the absence of the output device within said first time period on a display included in the portable audio device, if no communication link is detected between the output device and the communication port.

11. The method of claim 10, further comprising the step of, outputting the audio data stream upon establishment of a communicative link between the output device and the communication port within either of said first or said second time periods.

12. The method of claim 10, wherein the output device is a pair of headphones and the communication port is a one-eight inch mini-connector plug jack.

13. The method of claim 10, wherein the output device and the communication port link via a wireless connection.

14. The method of claim 10, wherein the output device and the communication connection link via a Bluetooth connection.

15. The method of claim 10, wherein the portable audio device comprises at least one of a compact disk player, a cassette tape player, a portable radio, and a moving pictures experts group audio layer-3 (MP3) player.

16. A portable battery powered audio device, comprising:

an output device for presenting an audio data stream; and means for controlling the output of an audio data stream communicatively coupled to the output device, wherein the controlling means detects the existence of a communicative link between the output device and the controlling means;

pauses output of the media data stream to the output device after a first predetermined time period, if no communicative link exist between the output device and the controlling means; and shuts down operation of the device after a second predetermined time period, if no communication link exists between the output device and the controlling means, said second time period being of a longer duration than said first time period;

wherein the battery powered audio device minimizes the amount of energy consumed when the output device is not communicatively linked to the controlling means.

17. The device of claim 16, wherein the portable battery powered audio device comprises at least one of a compact disk player, a cassette tape player, a portable radio, and a moving pictures experts group audio layer-3 (MP3) player.

18. The device of claim 16, further comprising means for indicating output device status.

19. The device of claim 16, wherein a communication link is at least one of a one eighth inch mini-connector and a bluetooth wireless connection.

20. A portable battery powered audio device, comprising:

an output device, comprising a set of headphones, for presenting an audio data stream; and a communication port for communicatively linking with the headphones;

a display;

at least one battery for powering the device;

a microprocessor communicatively coupled to the communication port for controlling the output of an audio data stream communicatively coupled to the headphones, the microprocessor being configured to execute a program of instructions causing the microprocessor to:

detect the existence of a communicative link between the headphones and the microprocessor;

pause output of the media data stream to the headphones after a first time period, if no communicative link exists between the headphones and the microprocessor;

provide a command on the display during the first time period instructing the user to attach the headphones, if no communicative link between the headphones and the microprocessor is detected during the first time period; and shut down operation of the device after a second time period, if no communication link exists between the headphones and the microprocessor, said second time period being of a longer duration than said first time period when measured from a common starting point.

* * * * *